United States Patent
Hung et al.

(10) Patent No.: US 9,780,199 B2
(45) Date of Patent: Oct. 3, 2017

(54) METHOD FOR FORMING SEMICONDUCTOR DEVICE

(71) Applicant: UNITED MICROELECTRONICS CORP., Hsin-Chu (TW)

(72) Inventors: Ching-Wen Hung, Tainan (TW); Chih-Sen Huang, Tainan (TW); Yi-Wei Chen, Taichung (TW); Shih-Fang Tzou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 78 days.

(21) Appl. No.: 14/862,165

(22) Filed: Sep. 23, 2015

(65) Prior Publication Data
US 2017/0084721 A1   Mar. 23, 2017

(51) Int. Cl.
*H01L 21/768* (2006.01)
*H01L 29/66* (2006.01)

(52) U.S. Cl.
CPC .. *H01L 29/66795* (2013.01); *H01L 21/76897* (2013.01); *H01L 29/66545* (2013.01)

(58) Field of Classification Search
CPC ......... H01L 29/66795; H01L 21/76897; H01L 29/66545
See application file for complete search history.

(56) References Cited

U.S. PATENT DOCUMENTS

| 6,297,149 B1 | 10/2001 | Stamper | |
|---|---|---|---|
| 6,548,394 B1 | 4/2003 | Peng et al. | |
| 2010/0270627 A1* | 10/2010 | Chang | H01L 21/28247 257/411 |
| 2011/0233679 A1* | 9/2011 | Chen | H01L 21/823431 257/368 |
| 2011/0260248 A1* | 10/2011 | Smeys | H01L 21/76898 257/347 |
| 2013/0334614 A1* | 12/2013 | Liaw | H01L 21/823821 257/401 |
| 2015/0076624 A1* | 3/2015 | Liu | H01L 21/32115 257/412 |
| 2015/0206945 A1* | 7/2015 | Chen | H01L 29/41783 257/384 |
| 2015/0214058 A1* | 7/2015 | Basker | H01L 21/283 257/769 |
| 2016/0190287 A1* | 6/2016 | Hsu | H01L 21/31144 438/299 |

OTHER PUBLICATIONS

Hung, Title of Invention: Method for Fabricating Semiconductor Device, U.S. Appl. No. 14/629,502, filed Feb. 24, 2015.

* cited by examiner

*Primary Examiner* — Joseph C. Nicely
*Assistant Examiner* — Pavel Ivanov
(74) *Attorney, Agent, or Firm* — Winston Hsu (57) ABSTRACT

A method of forming a semiconductor device includes following steps. Firstly, a gate structure is formed on a substrate, and two source/drain regions are formed. Then, a contact etching stop layer (CESL) is formed to cover the source/drain regions, and a first interlayer dielectric (ILD) layer is formed on the CESL. Next, a replace metal gate process is performed to form a metal gate and a capping layer on the metal gate, and a second ILD layer is formed on the first ILD layer. Following these, a first opening is formed in the second and first ILD layers to partially expose the CESL, and a second opening is formed in the second ILD to expose the capping layer. Finally, the CESL and the capping layer are simultaneously removed.

14 Claims, 7 Drawing Sheets

FIG. 13

METHOD FOR FORMING SEMICONDUCTOR DEVICE

BACKGROUND OF THE INVENTION

1. Field of the Invention

The present invention relates to a method of forming a semiconductor device, and more particularly to a method of forming a semiconductor device having a plug structure.

2. Description of the Prior Art

In recent years, the critical dimension (CD) in semiconductor processes has become finer with the increasing miniaturization of semiconductor devices. However, as the CD of the semiconductor device is continuously shrunk, the integrated process of forming a semiconductor device having metal gate also faces more challenges and limitations.

As the semiconductor industry has progressed into nanometer technology process nodes in pursuit of highly integrated and high-speed operation, current techniques utilize miniaturized through holes and inter-layer dielectric layers to form a multilayered interconnected wiring structure to electrically connect a metal gate and source/drain regions of a transistor, thereby providing signal input/output pathways for the transistor. However, the current photoresist and lithography techniques are no longer qualified enough to support the currently integrated process while forming the metal gate and contact plug. For example, the position shift of the contact plug electrically connected to the source/drain regions easily occurs, which may directly penetrate the metal gate, thereby affecting the electrical performance of the entire device. For these reasons, how to efficiently improve the current structure of the semiconductor device, as well as the method of forming the same, has become an important task in this field.

SUMMARY OF THE INVENTION

It is one of the primary objectives of the present invention to provide a method of forming a semiconductor device having a plug structure, so as to improve the electrical performance of the entire semiconductor structure.

To achieve the purpose described above, the present invention provides a method of forming a semiconductor device including following steps. First of all, a substrate is provided. Next, a gate structure is formed on the substrate, wherein the gate structure has a polysilicon gate. Then, two source/drain regions adjacent to the gate structure are formed, and a contact etching stop layer is formed on the substrate to cover the source/drain regions. Following these, a first dielectric layer is formed on the contact etching stop layer, and a replace metal gate process is performed to form a metal gate and a capping layer on the metal gate. Then, a second interlayer dielectric layer is formed on the first interlayer dielectric layer, and a first opening is formed in the second interlayer dielectric layer and first interlayer dielectric layer to expose the contact etching stop layer on the source/drain regions. Finally, a second opening is formed in the second dielectric layer and first dielectric layer to expose the capping layer and the contact etching stop layer on the source/drain regions and the capping layer on the metal gate are simultaneously removed.

The method of forming a semiconductor device in the present invention mainly forms the source/drain contact opening and the gate structure contact opening separately by using the contact etching stop layer and the capping layer as a stop layer respectively, so that, a portion of the contact etching stop layer and a portion of the capping layer may be exposed from the source/drain contact opening and the gate structure contact opening respectively. Thus, the contact openings directly connected to the source/drain regions and the metal gate may be easily formed subsequently through simultaneously removing the exposed portions of the contact etching stop layer and the capping layer. In this manner, the method of forming the semiconductor device in the present invention is able to effectively improve the current issues and limitation in lithography techniques, thereby providing a preferred integrated process while forming the metal gate and contact plug.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 12 are schematic diagrams illustrating a method of forming a semiconductor device according to one preferred embodiment of the present invention, wherein, FIGS. 1, 6 and 9 are schematic top views of the semiconductor device in the forming processes, and FIGS. 2, 7 and 10 are cross-sectional view taken along the cross line A-A' in FIGS. 1, 6 and 9.

DETAILED DESCRIPTION

To provide a better understanding of the present invention, preferred embodiments will be described in detail. The preferred embodiments of the present invention are illustrated in the accompanying drawings with numbered elements.

Figure 1:
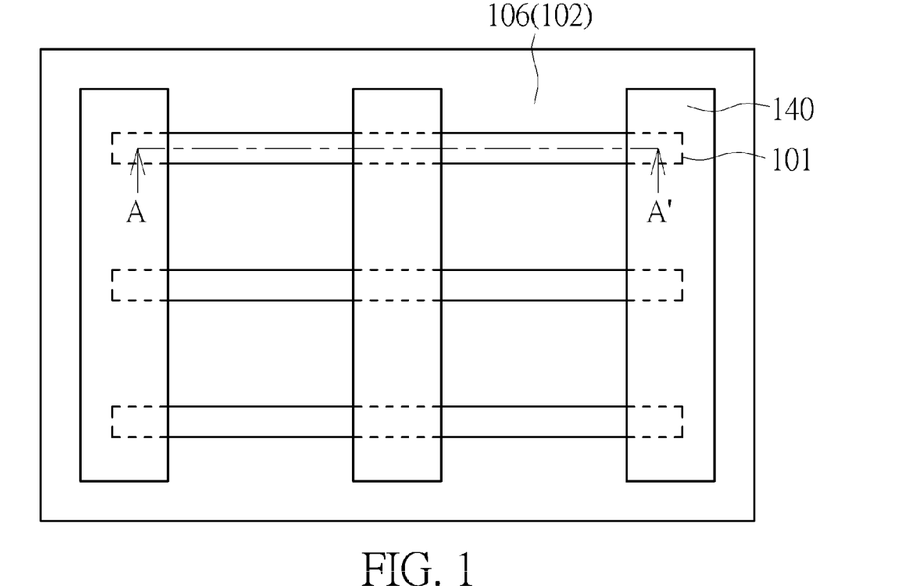
Figure 2:
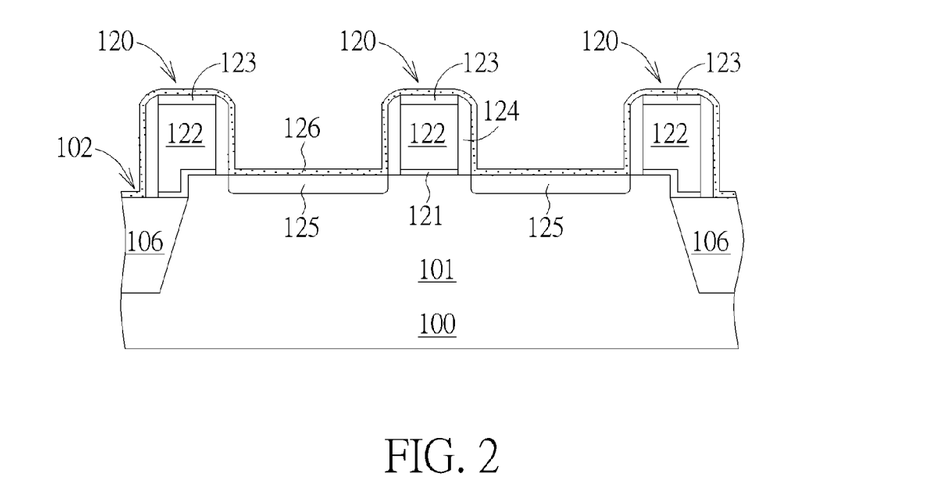
Figure 4:
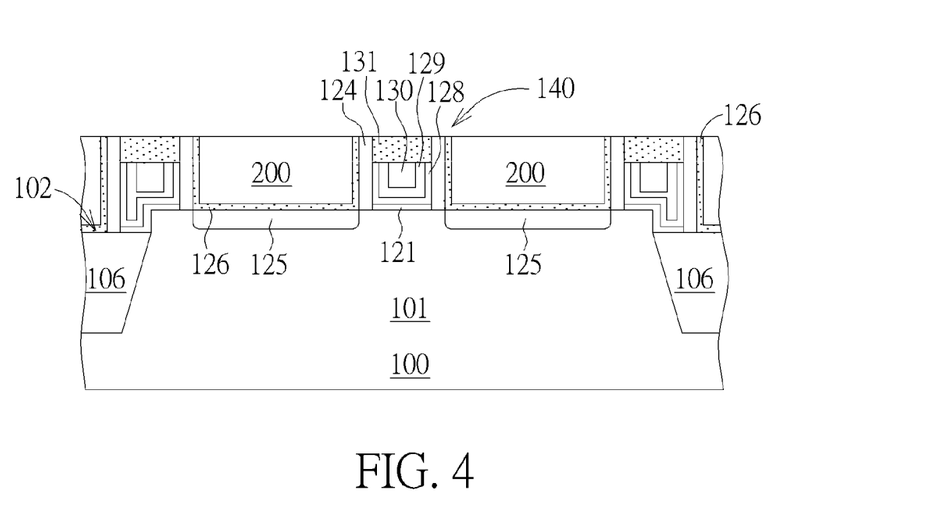
Figure 5:
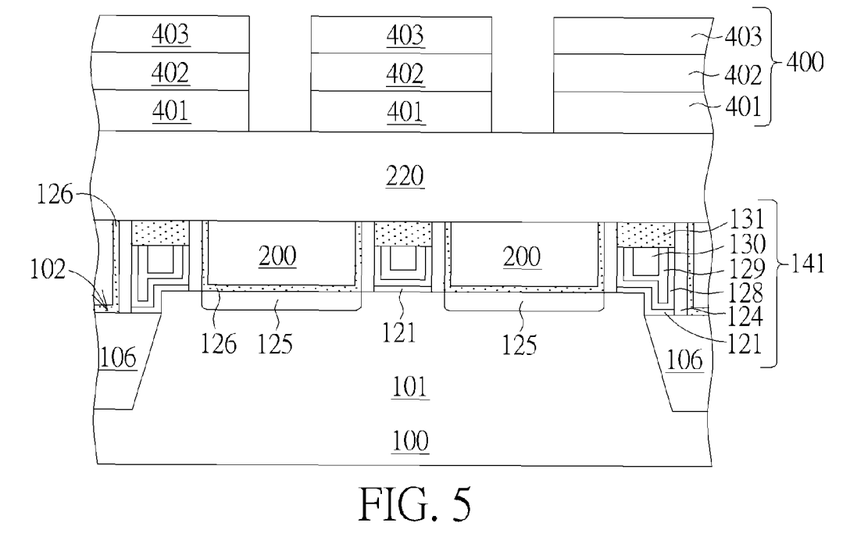
Figure 6:
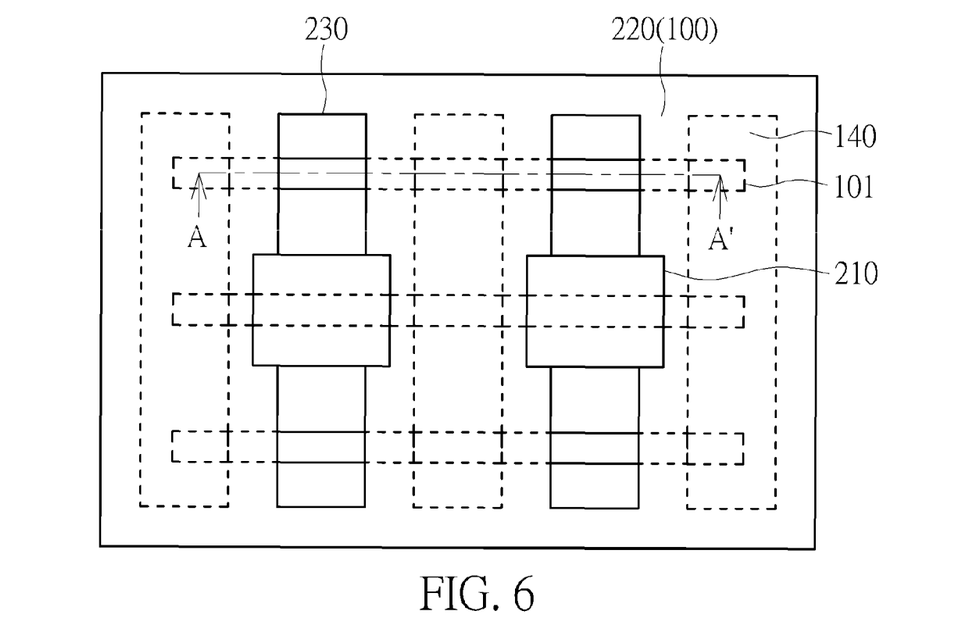
Figure 7:
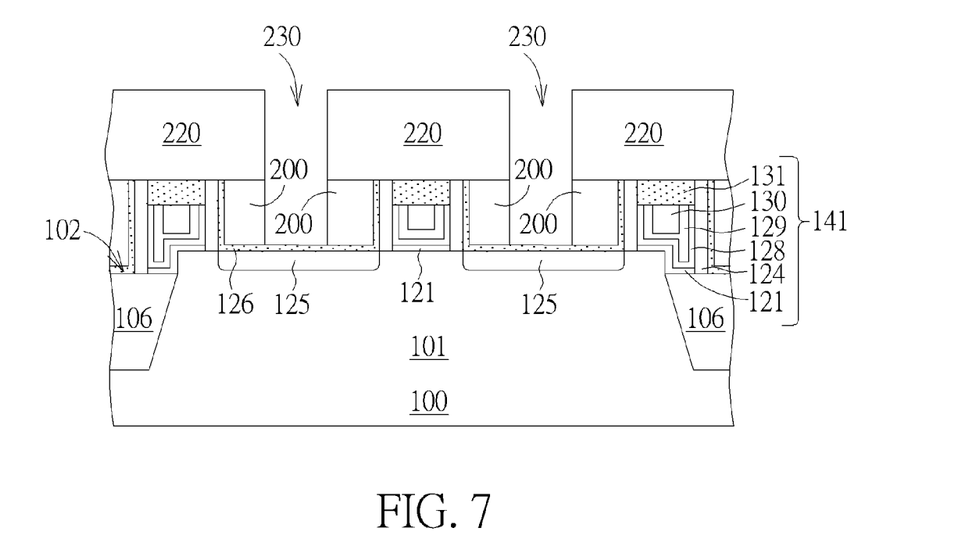
Figure 8:
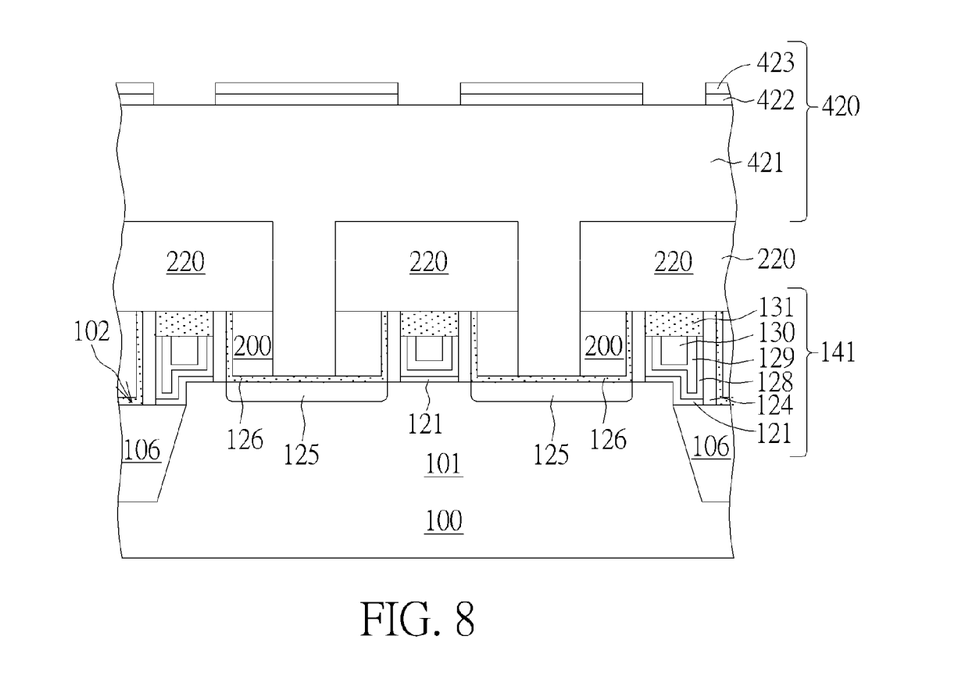
Figure 9:
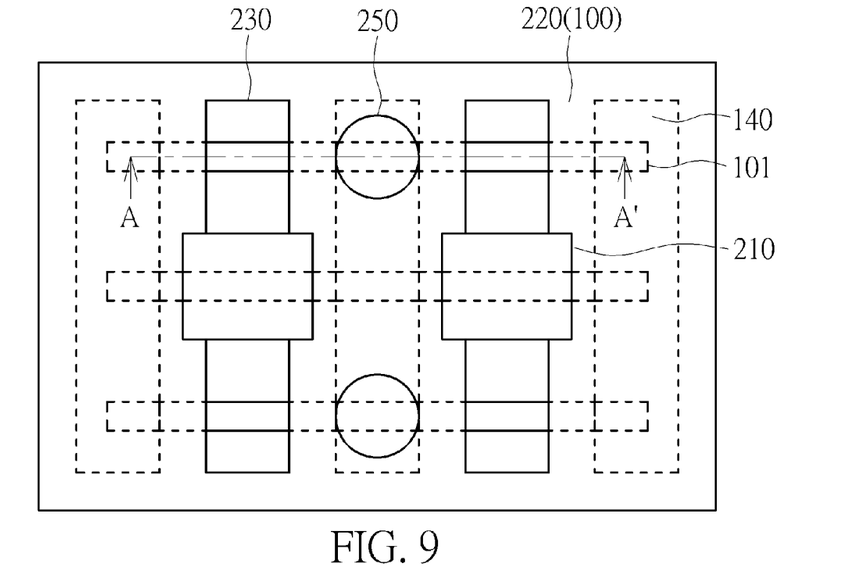
Figure 10:
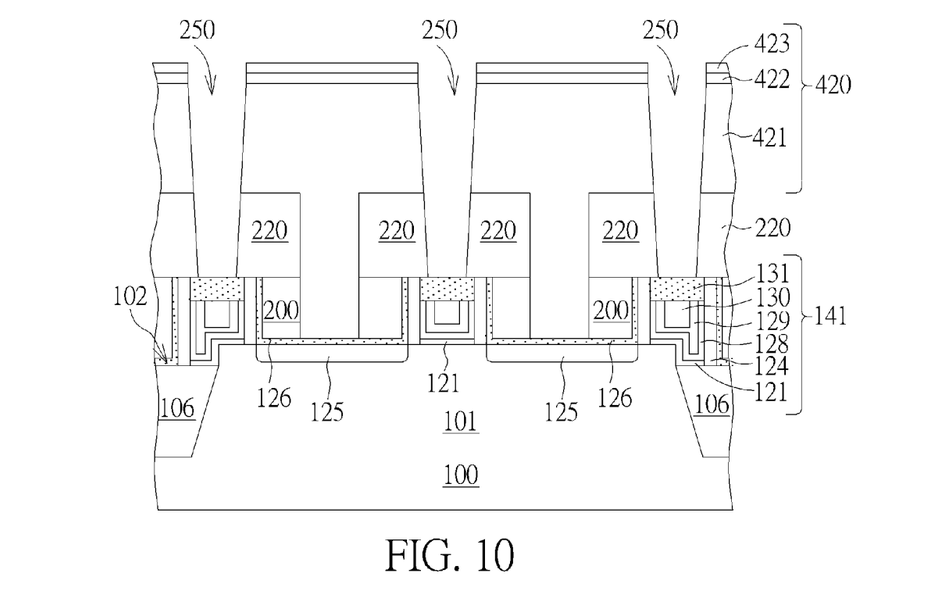

Referring to FIG. 1 to FIG. 12, which are schematic diagrams illustrating a method of forming a semiconductor device according to one preferred embodiment of the present invention, wherein, FIGS. 1, 6 and 9 are schematic top views of the semiconductor device in the forming processes, and FIGS. 2, 7 and 10 are cross-sectional view taken along the cross line A-A' in FIGS. 1, 6 and 9. First of all, a substrate 100 is provided, and the substrate 100 may include a semiconductor substrate, like a silicon substrate, an epitaxial silicon substrate, a silicon germanium substrate, a silicon carbide substrate or a silicon-on-insulator (SOI) substrate for example, or a non-semiconductor substrate, like a glass substrate for example, but is not limited thereto. Also, at least a fin-shaped structure 101 may be formed in the substrate 100.

In one embodiment, the formation of the fin-shaped structure 101 may include a spacer self-aligned double-patterning (SADP) process, also known as sidewall image transfer (SIT) process. For example, a patterned mask (not shown in the drawings) may be formed on the substrate 100, a pattern of the patterned mask may be transferred to the substrate 100 through an etching process, and the patterned mask is removed, to form a plurality of shallow trenches 102 in the substrate 100, as shown in FIG. 1. Then, an insulation layer 106 is formed in the shallow trenches 102, so that, a portion of the substrate 100 may protrude from the insulation layer 106 to form the fin-shaped structure 101 and the insulation layer 106 may function like shallow trench isolations (STI), as shown in FIG. 2.

However, people skilled in the art shall easily realize that the formation of the fin shaped structures 101 in the present invention is not limited to the aforementioned processes, and may also be accomplished by other methods. For example, in one embodiment, the fin shaped structure 101 may also be formed by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium layer, to function like the corresponding fin shaped structures. Otherwise, in the embodiment of having the SOI substrate (not shown in the drawing), the patterned mask may be used to etch a semiconductor layer (not shown in the drawings) on the substrate until reaching a bottom oxide layer (not shown in the drawing) underneath to form the corresponding fin shaped structures.

Next, at least one gate structure 140 across the fin shaped structure 101 is formed on the substrate 100. In the present embodiment, the formation of the gate structure 140 may include firstly forming a high-k gate dielectric layer 121, a dummy gate 122 and a capping layer 123 on the substrate 100 to compose a gate stack structure 120, and then forming a spacer 124 surrounding the gate stack structure 120 and two source/drain regions 125 at two sides of the gate stack structure 120 in the fin shaped structures 101, as shown in FIG. 2. In one embodiment, the high-k gate dielectric layer 121 may include silicon oxide or silicon nitride; the dummy gate 122 may include polysilicon, like undoped polysilicon, doped polysilicon, amorphous silicon or a composite material thereof for example; and the capping layer 123 may optionally include a monolayer structure or a multilayer structure consisting of silicon oxide, silicon carbide, silicon nitride or silicon oxynitride, but not limited thereto. Also, the spacer 124 may also optionally include a monolayer structure or a multilayer structure, and the spacer 124 may include high temperature oxide (HTO), silicon nitride, silicon oxide, silicon oxynitride or silicon nitride formed by hexachlorodisilane ($Si_2Cl_6$) (HCD-SiN), but is not limited thereto. A contact etch stop layer (CESL) 126, having a monolayer structure as shown in FIG. 2 or a multilayer structure may be formed then, to cover the gate stack structure 120, wherein the contact etch stop layer 126 may include silicon nitride, but not limited thereto.

Figure 3:
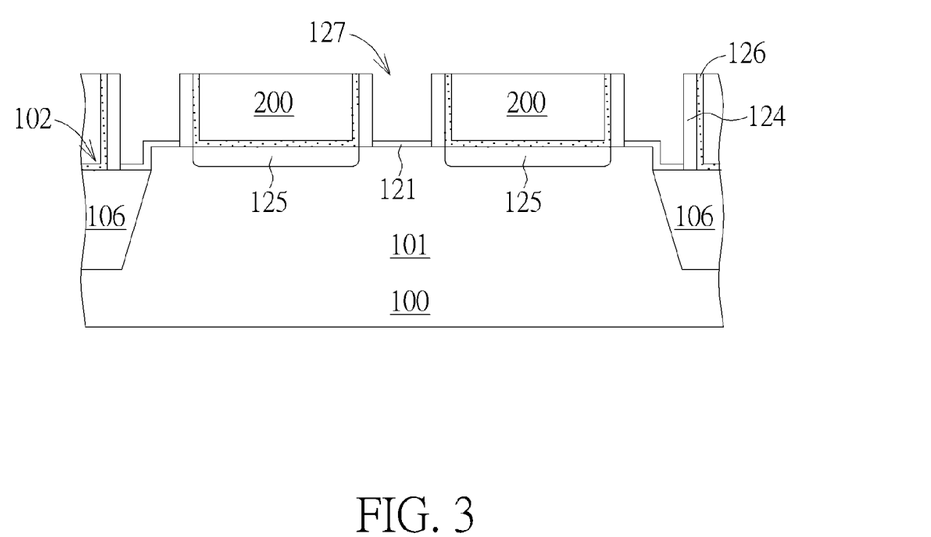

Following these, a replacement metal gate (RMG) process may be performed, to replace the dummy gate 122 with a metal gate, thereby forming the gate structure 140. Precisely, the replacement metal gate process may include forming an interlayer dielectric material layer (not shown in the drawings) on the substrate 100, to completely cover the gate structure 140, performing a planarization process, such as a chemical mechanical polish (CMP) process, an etching back process or a sequentially performed chemical mechanical polish process and etching back process, to remove a portion of the interlayer dielectric material layer, a portion of the contact etch stop layer 126, a portion of the spacer 124, and the entire capping layer 123 up to the exposure of the dummy gate 122, and further removing the dummy gate 122 through a selective dry etching or wet etching process, thereby forming a gate recess 127 and an interlayer dielectric (ILD) layer 200, as shown in FIG. 3. Please note that, the interlayer dielectric layer 200 preferably includes materials having different etching selectivity relative to that of the contact etch stop layer 126, like silicon oxide, silicon oxynitride, or silicon carbonitride for example.

Then, a work function metal material (not shown in the drawings), such as a P type work function metal layer, like nitride of nickel (Ni), tungsten (W), molybdenum (Mo), tantalum (Ta) or titanium (Ti) for example, or an N type work function metal layer, like titanium aluminide (TiAl), aluminum zirconium (ZrAl), aluminum tungsten (WAl), aluminum tantalum (TaAl) or aluminum hafnium (HfAl) for example; a barrier material layer (not shown in the drawings), like Ti/titanium nitride (TiN) or Ta/tantalum nitride (TaN) for example; and a metal material layer (not shown in the drawings), like tungsten or aluminum (Al) for example, are sequentially filled in the gate recess 127. Also, a chemical mechanical polish process is carried out to remove a portion of the work function metal material layer, a portion of the barrier material layer and a portion of the metal material layer outside the gate recess 127, and an etching back process is then carried out, to partially remove the work function metal material layer, the barrier material layer and the metal material layer to not fill the gate recess 127, thereby forming a work function metal layer 128, a barrier layer 129 and a metal layer 130, as shown in FIG. 4. Subsequently, a capping layer 131 may be formed to fill the gate recess 127, and the capping layer 131 preferably includes the same material or different materials having the same etching selectivity to the contact etch stop layer 126, like silicon nitride for example. Thus, the interlayer dielectric layer 200 may include a top surface level with a top surface of the gate structure 140, namely, the capping layer 131 of the gate structure 140.

It is worth noting that, although the forming method of the gate structure 140 of the present embodiment is exemplified as a "gate-last" process and a "high-k first" process, the present invention is not limited thereto. In other embodiments, the forming method of the present invention may also be accomplished through a "gate-first" process, or a "high-k last" process or further include other processes. For example, in one embodiment, the method may further include a selective epitaxial growth (SEG) process before the contact etch stop layer 126 is formed, forming an epitaxial layer (not shown in the drawings) in the substrate 100 adjacent to the gate stack structure 120 for providing requested compressive/tensile stress to the channel region, but not limited thereto; or in another embodiment, a metal gate structure (not shown in the drawings) at least including a work function layer and a metal gate may be directly formed.

In the following, a source/drain contact slot forming process is performed. Precisely speaking, a dielectric layer 220 and a patterned mask layer 400 are sequentially formed on the gate structure 140 and the interlayer dielectric layer 200. In one embodiment, the dielectric layer 220 may preferably include the same material as that of the interlayer dielectric layer 200, such as silicon oxide, silicon oxynitride, or silicon carbonitride; and the patterned mask layer 400 may optionally include a monolayer structure or a multilayer structure consisting of an organic dielectric layer (ODL) 401, for example being made of 365 nm I-line photoresist material or novolac resin, a silicon containing hard mask (SHB) layer 402, for example being made of organo-silicon polymers or polysilane, and a photoresist layer 403, for example being made of 248 nm or 193 nm phtoresist material (e.g. KrF photoresist layer), as shown in FIG. 5.

Then, a removing process, such as a dry etching process, a wet etching process or a sequentially performed a dry etching process and a wet etching process, may be carried out by using the patterned mask layer 400 as a mask, to form at least one opening 230 at two sides of the gate structure 140 in the dielectric layer 220 and the interlayer dielectric layer 200, up to the exposure of the contact etch stop layer 126 underneath. In other words, the removing process is performed by using the contact etch stop layer 126 as a stop layer, so that, a portion of the contact etch stop layer 126 covered on the source/drain regions 125 may be exposed from the openings 230, as shown in FIG. 7.

It is noted that, before performing the source/drain contact slot forming process, a slot-cut pattern 210 at least partially overlapping the openings 230 may be previously formed on the dielectric layer 220 and the interlayer dielectric layer 200, as shown in FIG. 6. Namely, the aforementioned removing process is performed by simultaneously using the slot-cut pattern 210 and the patterned mask layer 400 as a mask, for forming the openings 230. In this manner, since the patterned mask layer 400 is formed crossing right over the slot-cut pattern 210 and partially overlaps with the slot-cut pattern 210 in a projection direction, the opening 230 formed accordingly thereto may be divided into two parts, as shown in FIG. 6. However, people skilled in the art shall easily realize that the source/drain contact slot forming process in the present invention may not limited thereto, and in another embodiment, the slot-cut pattern 210 may also be omitted according to the practical requirements of the devices.

After completely removing the patterned mask layer 400 and the slot-cut pattern 210, a gate structure contact slot forming process is performed, to form at least one opening 250, as shown in FIG. 9. In one embodiment, the gate structure contact slot forming process may also performed through a similar process to that of the aforementioned source/drain contact slot forming process, for example including forming a patterned mask layer 420 consisting of an organic dielectric material layer 421 filled in the openings 230, for example being made of 365 nm I-line photoresist material or novolac resin, a silicon containing hard mask material layer 422, for example being made of organo-silicon polymers or polysilane, and a photoresist layer 423, for example being made of 248 nm or 193 nm phtoresist material (e.g. KrF photoresist layer), as shown in FIG. 8, and performing a removing process, such as a dry etching process, a wet etching or a sequentially performed dry and wet etching process, by using the patterned mask layer (namely, the hard mask material layer 422 thereof) as a mask to transfer patterns thereof to the dielectric layer 220 and the interlayer dielectric layer 200 underneath, thereby forming the openings 250 in the dielectric layer 220 and the interlayer dielectric layer 200, up to the exposure of the capping layer 131 of the gate structure 140. In other words, the removing process is performed by using the capping layer 131 as a stop layer, so that, at least a portion of the capping layer 131 may be exposed from the openings 250, as shown in FIG. 10.

After that, after completely removing the patterned mask layer 420, another removing process, also including a dry etching process, a wet etching process or a sequentially performed a dry etching process and a wet etching process, may be performed to simultaneously remove the contact etch stop layer 126 exposed from the opening 250 and the capping layer 131 exposed from the openings 250, thereby forming the openings 240, 260 directly connecting the source/drain regions 125 and the metal gate 130, respectively. In this manner, the source/drain regions 125 under the exposed contact etch stop layer 126, as well as the metal layer 130 under the exposed capping layer 131, may thereby be exposed from the openings 240, 260 respectively, as shown in FIG. 10. Namely, the another removing process is performed by using the dielectric layer 220 as a mask, to simultaneously remove the exposed contact etch stop layer 126 and the exposed capping layer 131 through the same etching step.

Figure 11:
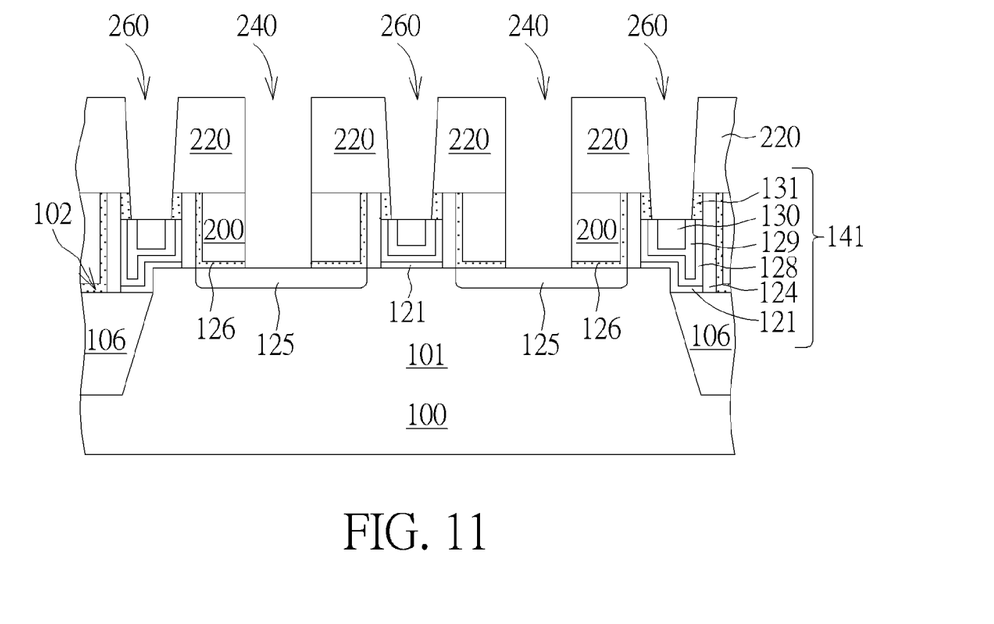
Figure 12:
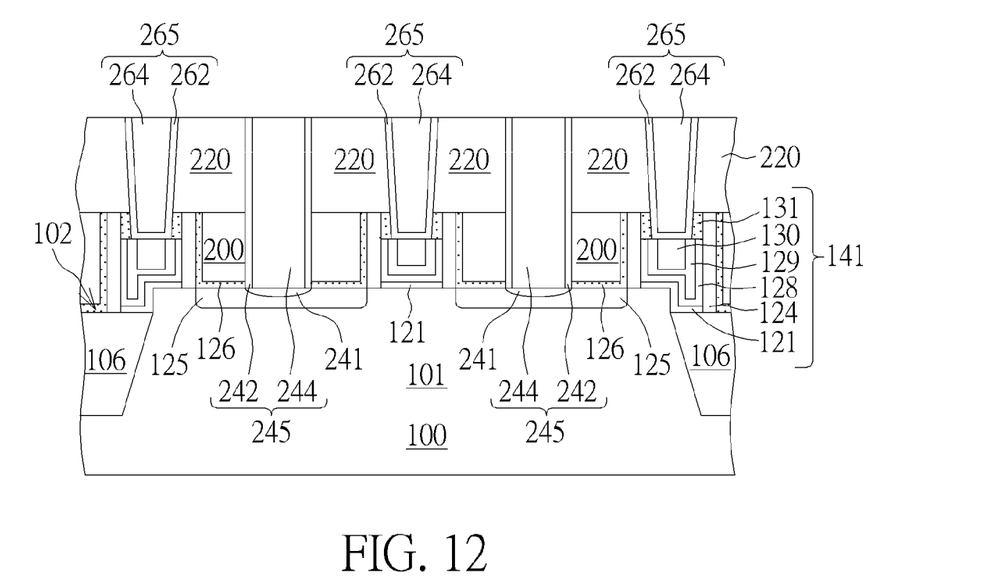

Finally, after performing a cleaning process, for example, using argon to clean surfaces of the openings 240, 260, a self-aligned silicidation process may be optionally carried out in the openings 240 and a contact plug forming process is performed then in the openings 240, 260. Precisely, the silicidation process may include conformally forming a metal layer (not shown in the drawings) in the openings 240, wherein the metal layer may include metal like titanium, cobalt (Co), nickel (Ni) and platinum (Pt) for example, but not limited thereto, and performing an annealing process, such as a soak annealing process and a spike annealing process, driving the metal layer to react with the source/drain 125 exposed from the openings 240 and to form a silicide layer 241, including titanium silicide (TiSi) for example, but not limited thereto. Following these, the unreacted metal layer is removed and the contact plug forming process is then carried out, including sequentially forming a barrier material layer (not shown in the drawings) and a metal material layer (not shown in the drawings) in the openings 240, 260, and removing a portion of the metal material layer and a portion of the barrier material layer through a planarization process (e.g. a chemical mechanical polish process or an etching back process), to form a plugs 245, 265 in the openings 240, 260 respectively. Each of the contact plugs 245, 265 may level with each other and includes a barrier layer 242, 262 and a contact metal layer 244, 264, as shown in FIG. 11. In one embodiment, the barrier layer 242, 262 may include titanium, titanium nitride, tantalum or tantalum nitride; and the contact metal layer 244, 264 may include tungsten or other metal materials having lower resistance, but not limited thereto.

Figure 13:
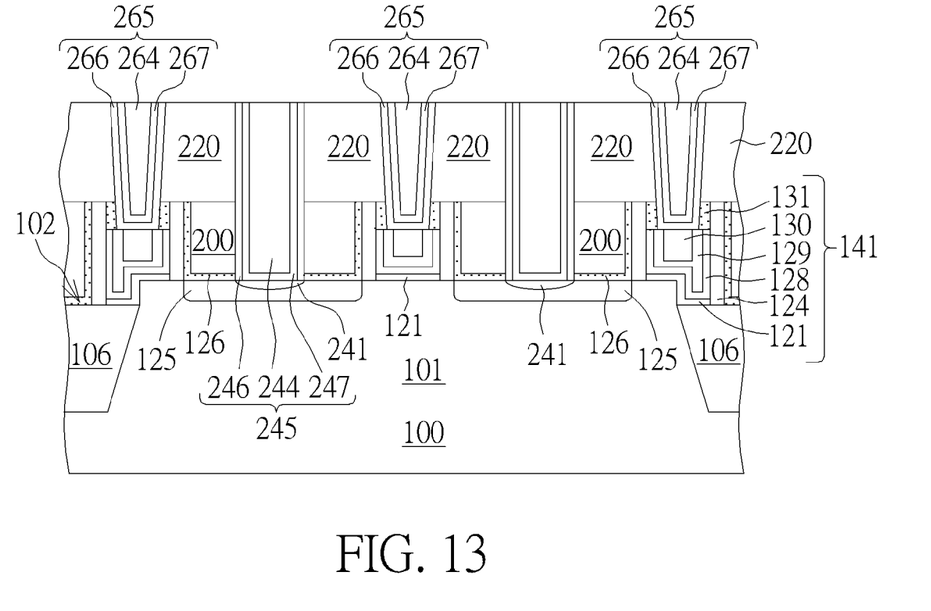
FIG. 13 is a schematic diagram illustrating a method of forming a semiconductor device according to another preferred embodiment of the present invention.

In addition, people skilled in the art shall easily realize that the silicidation process and the contact plug forming process of the present invention is not limited to the aforementioned steps, may include other methods which are well known by one skilled in the art. For example, in another embodiment of the present invention, a first metal layer (not shown in the drawings), such as a titanium layer, and a second metal layer (not shown in the drawings), such as a titanium nitride, may be formed sequentially in the openings 240, and an annealing process is performed to drive the reaction between the first metal layer with the exposed source/drain regions 125 to form the silicide layer 241. In this way, only a portion of the first metal layer and the second metal layer may remain in the openings 240, to function as a first barrier layer 246 and a second barrier layer 247, as shown in FIG. 13, wherein the first barrier layer 246 only forms on the sidewalls of the openings 240, and directly contacts the interlayer dielectric layers 220, 200. On the other hand, both of the first metal layer and the second metal layer remain in the openings 260, to function as a U-shaped first barrier layer 266 and a U-shaped second barrier layer 267, as shown in FIG. 13.

Through the above-mentioned steps, the semiconductor device of the preferred embodiment of the present invention is obtained. The method of present invention mainly forms the source/drain contact opening and the gate structure contact opening separately by using the contact etching stop layer and the capping layer as stop layer respectively, so that, a portion of the contact etching stop layer and a portion of the capping layer may be exposed from the source/drain contact opening and the gate structure contact opening respectively. Thus, the contact openings directly connected to the source/drain regions and the metal gate may be easily formed subsequently through simultaneously removing the exposed portions of the contact etching stop layer and the capping layer. Thus, the method of forming the semiconductor device of the present invention may effectively improve the current issues and limitation in lithography techniques, thereby providing a preferred integrated process while forming the metal gate and contact plug.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate;
   forming a gate structure on the substrate, wherein the gate structure has a polysilicon gate;
   forming two source/drain regions adjacent to the gate structure;
   forming a contact etching stop layer on the substrate, covering the source/drain regions;
   forming a first dielectric layer on the contact etching stop layer;
   performing a replace metal gate process, to form a metal gate and a capping layer on the metal gate;
   forming a second dielectric layer on the first dielectric layer;
   forming a preliminary etch mask on the second dielectric layer;
   after forming the preliminary etch mask, forming a patterned mask layer on the second dielectric layer;
   forming a first opening in the second dielectric layer and the first dielectric layer by using the patterned mask layer, wherein the first opening is formed as two separate portions separated by the masking effect of the preliminary etch mask, and the two separate portions of the first opening to expose portions of the contact etching stop layer on the source/drain regions;
   forming a second opening in the second dielectric layer to expose a portion the capping layer; and
   simultaneously removing the portion of the contact etching stop layer on the source/drain regions and the portion of the capping layer.

2. The method of forming the semiconductor device according to claim 1, wherein the forming of the source/drain regions comprises:
   forming an epitaxial layer in the substrate adjacent to the gate structure.

3. The method of forming the semiconductor device according to claim 1, wherein the capping layer and the contact etching stop layer comprises a same material.

4. The method of forming the semiconductor device according to claim 1, wherein the capping layer and the contact etching stop layer comprise different materials.

5. The method of forming the semiconductor device according to claim 1, further comprising:
   forming another patterned mask layer on the second dielectric layer to fill in the first opening, wherein the second opening is formed by using the another patterned mask layer as a mask.

6. The method of forming the semiconductor device according to claim 1, further comprising:
   performing a silicidation process to form a silicide layer on the source/drain regions in the first opening.

7. The method of forming the semiconductor device according to claim 1, further comprising:
   forming a first plug and a second plug in the first opening and the second opening respectively.

8. The method of forming the semiconductor device according to claim 7, wherein the first plug and the second plug are formed simultaneously.

9. The method of forming the contact structure according to claim 7, wherein each of the first plug and the second plug comprises a barrier layer and a contact metal layer.

10. The method of forming the semiconductor device according to claim 7, wherein the top of the first plug is level with the top of the second plug.

11. The method of forming the semiconductor device according to claim 1, wherein the top of the capping layer is level with the top of the first dielectric layer.

12. The method of forming the semiconductor device according to claim 1, further comprising:
    removing the slot-cut pattern.

13. The method of forming the semiconductor device according to claim 1, further comprising:
    forming a fin shaped structure in the substrate, wherein the gate structure is formed across the fin shaped structure, and the source/drain regions are formed in the fin shaped structure.

14. The method of forming the semiconductor device according to claim 13, further comprising:
    forming a shallow trench isolation in the substrate and surrounding the fin-shaped structure with the shallow trench isolation.

* * * * *